United States Patent [19]

Tanaka et al.

[11] 4,335,322
[45] Jun. 15, 1982

[54] PULSE GENERATOR FOR PRODUCING A PULSE HAVING A PULSE WIDTH DEPENDENT ON AN INPUT SIGNAL

[75] Inventors: Kouichi Tanaka, Tokyo; Masaharu Mori, Warabi, both of Japan

[73] Assignees: Nippon Electric Co., Ltd.; Clarion Co., Ltd., both of Tokyo, Japan

[21] Appl. No.: 75,872

[22] Filed: Sep. 17, 1979

[51] Int. Cl.³ .................... H03K 5/00; H03K 17/28
[52] U.S. Cl. ............................ 307/542; 307/592; 307/597; 307/265; 328/112
[58] Field of Search ............... 307/253, 294, 265, 267, 307/542; 328/112, 72, 165, 58; 323/22 T

[56] References Cited

U.S. PATENT DOCUMENTS

| 3,184,607 | 5/1965  | Greene         | 307/294 |
| 3,414,735 | 12/1968 | Harris et al.  | 307/394 |
| 3,491,256 | 1/1970  | Simmons        | 307/294 |
| 3,571,626 | 3/1971  | Reif           | 307/267 |
| 3,609,563 | 9/1971  | Zinn           | 328/112 |
| 3,712,992 | 1/1973  | Schertz et al. | 307/267 |
| 3,800,168 | 3/1974  | Cochran        | 307/293 |
| 3,814,954 | 6/1974  | Cake           | 307/293 |
| 3,852,623 | 12/1974 | Nelson et al.  | 307/293 |
| 4,156,202 | 5/1979  | Takahashi      | 328/165 |

Primary Examiner—Stanley D. Miller, Jr.
Assistant Examiner—B. P. Davis
Attorney, Agent, or Firm—Sughrue, Mion, Zinn, Macpeak and Seas

[57] ABSTRACT

In a pulse generator responsive to an input pulse, use is made of a time constant circuit having a time constant for charge and a time constant for discharge considerably greater than the former. The time constant circuit is rapidly charged during presence of the input pulse in accordance with the time constant for charge, through a switching circuit kept on, while it is slowly discharged in accordance with the time constant for discharge after the switching circuit is rendered off due to disappearance of the input pulse. During charging and discharging, the time constant circuit gives a variable level to a threshold circuit for producing an output pulse when the variable level exceeds a threshold level. The output pulse lasts until the variable level is rendered less than the threshold level after disappearance of the input pulse. Additionally, the pulse generator comprises a combination of a constant current portion and a constant voltage portion to stabilize the input and output pulses. The pulse generator is suitable for a noise pulse canceller for a radio receiver.

7 Claims, 8 Drawing Figures

PULSE GENERATOR FOR PRODUCING A PULSE HAVING A PULSE WIDTH DEPENDENT ON AN INPUT SIGNAL

BACKGROUND OF THE INVENTION

This invention relates to a pulse generator for use in a noise pulse canceller. The pulse generator is specifically useful in a radio receiver for an automobile or the like.

In a noise pulse canceller, a pulse generator is used together with a gate circuit to which a circuit input signal is supplied through a low-pass filter. The input signal is supplied to the pulse generator through a high-pass filter. A conventional pulse generator is usually a monostable multivibrator for supplying the gate circuit with a gating pulse during presence of a noise pulse in the circuit input signal. The gate circuit interrupts the circuit input signal during presence of the gating pulse and produces an output signal free from the noise pulse. It is necessary that the gating pulse should last during existence of the noise pulse, which has a width irregularly variable in general. Moreover, the width of the noise pulse tends to be shortened and widened by the high-pass and low-pass filters, respectively, as will later be described with reference to a few figures of the accompanying drawing. Accordingly, it is difficult to completely suppress the noise pulse by the use of the conventional pulse generator.

SUMMARY OF THE INVENTION

It is an object of this invention to provide a pulse generator which is capable of producing an output pulse of a pulse width variable with the width of an input pulse.

It is another object of this invention to provide a pulse generator of the type described, which is suitable for use in a noise pulse canceller for a radio receiver for an automobile or the like.

A pulse generator according to this invention is responsive to an input pulse for producing an output pulse. The pulse generator comprises first means responsive to the input pulse for producing a charging signal during presence of the input pulse, and a time constant circuit responsive to the charging signal and having a first time constant for charge and a second time constant for discharge which is greater than the first time constant. The time constant circuit is charged in accordance with the first time constant when the charging signal is supplied thereto and discharged in accordance with the second time constant when the input pulse disappears, the time constant circuit thereby producing a variable level signal having a variable level between a first and a second predetermined level. The pulse generator further comprises second means responsive to the input pulse and the variable level signal and having a preselected level intermediate between the first and second predetermined levels for producing a wide pulse in timed relation to the input pulse. The wide pulse is wider than the input pulse in pulse width and lasts until the variable level becomes equal to the preselected level during the discharge of said time constant circuit. In addition, the pulse generator comprises third means coupled to the second means for producing the wide pulse as the output pulse.

DESCRIPTION OF THE PREFERRED EMBODIMENTS

Figure 1:
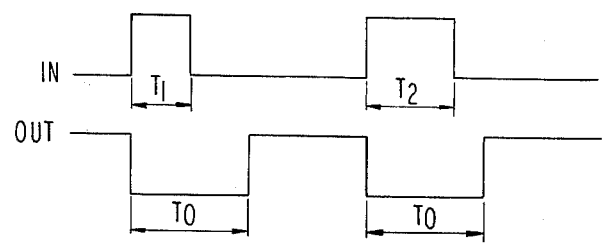
FIG. 1 shows an input wave form supplied to a conventional pulse generator and an output wave form produced thereby.
Figure 2:
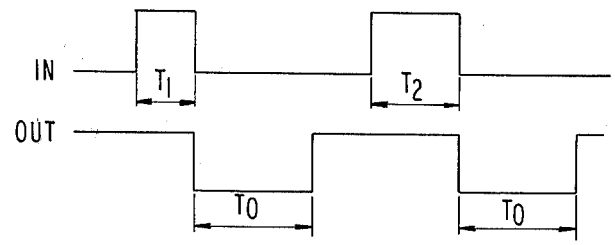
FIG. 2 shows an input wave form supplied to another conventional pulse generator and an output wave form produced thereby.
Figure 3:
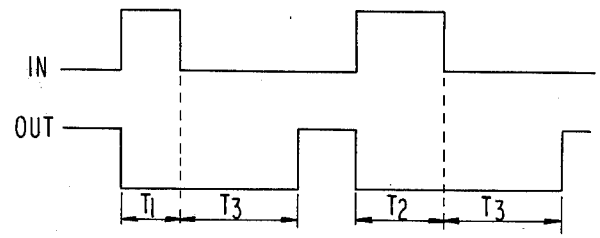
FIG. 3 shows an input wave form supplied to a pulse generator according to an embodiment of this invention and an output wave form produced thereby.

Referring to FIGS. 1 through 3, an input signal IN supplied to a pulse generator includes two input pulses of the widths $T_1$ and $T_2$ by way of example. As illustrated in FIG. 1, an output signal OUT produced by a conventional pulse generator includes two output pulses of a common pulse width $T_0$. The leading edge of each output pulse is coincident with the leading edge of each input pulse. As shown in FIG. 2, an output signal OUT produced by another conventional pulse generator includes two output pulses that again have a common pulse width $T_0$. The leading edge of each output pulse is, however, in coincidence with the trailing edge of each input pulse. In contrast, an output signal OUT produced by a pulse generator according to the present invention includes two output pulses that have different pulse width $T_1+T_3$ and $T_2+T_3$ when the input pulse widths are $T_1$ and $T_2$, respectively, as depicted in FIG. 3. The leading edge of each output pulse is simultaneous with the leading edge of the corresponding input pulse. Each output pulse lasts during presence of the corresponding input pulse and further a predetermined period $T_3$ after disappearance of the input pulse under consideration. This means, as will be described later, that a pulse generator according to this invention serves well in a noise pulse canceller for cancelling noise pulses superposed on an amplitude or a frequency modulated signal.

Figure 4:
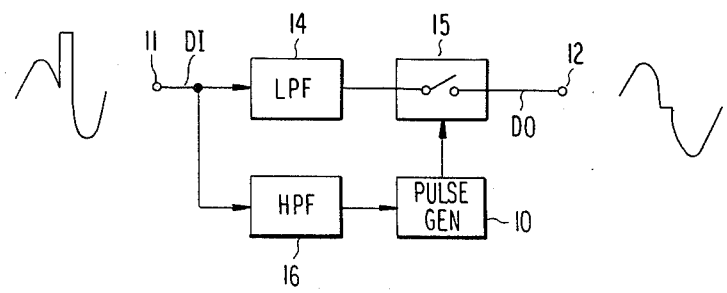
FIG. 4 is a block diagram of a noise pulse canceller to which a pulse generator according to this invention is applicable.

Referring now to FIG. 4, a noise pulse canceller comprises a pulse generator 10 according to this invention. The noise pulse canceller has a device input terminal 11 for a device input signal DI and a device output terminal 12 supplied with a device output signal D0. The device input signal DI is fed through a low-pass filter 14 to a gate circuit 15. The device input signal DI is also supplied to a high-pass filter 16 to produce trigger pulses when the noise pulses are detected thereby. Energized by the trigger pulses, the pulse generator 10 supplies the gate circuit 15 with gating or output pulses exemplified in FIG. 3. During presence of the gating pulses, the gate circuit 15 interrupts the device input signal supplied through the low-pass filter 14 to produce the device output signal DO exempted from the noise pulses.

In the noise pulse canceller depicted in FIG. 4, the low-pass and high-pass filters 14 and 16 tend to widen and shorten the pulse width of each noise pulse, respectively. As a result, the trigger pulses become shorter than the respective noise pulses, which may have the pulse width widened by the low-pass filter 14. In addition, the widths of the noise pulses are irregularly varied. It is clear that a conventional pulse generator is not suitable for use in a noise pulse canceller. According to this invention, the pulse generator 10 makes the respective gating pulses suppress the noise pulses widened by the low-pass filter 14, by producing the gating pulses lasting during presence of the widened noise pulses.

Figure 5:
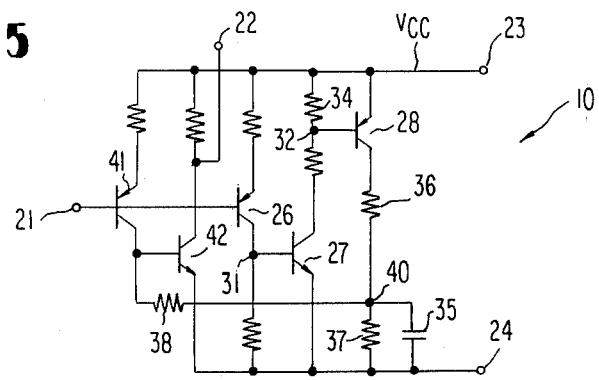
FIG. 5 is a circuit diagram of a pulse generator according to a first embodiment of this invention.

Referring to FIG. 5, a pulse generator 10 according to a first embodiment of this invention has a first terminal 21 for an input signal which is typically a trigger pulse or a noise pulse detected by a high-pass filter 16 shown in FIG. 4 and a second terminal 22 for an output signal which may be a gating pulse. The pulse generator 10 further has third and fourth terminals 23 and 24 for connection to an electric power source. In this pulse generator 10, the third terminal 23 is given an electric voltage of $V_{cc}$ while the fourth terminal 24 is grounded. The pulse generator 10 comprises a first transistor 26 of the PNP type, a second transistor 27 of the NPN type, and a third transistor 28 of the PNP type. The first transistor 26 has the base connected to the first terminal 21 and the emitter connected to the third terminal 23 through a resistor. The collector of the first transistor 26 and the base of the second transistor 27 are connected in common to a first point 31 of connection between the first and the second transistors 26 and 27. The point 31 is connected through a resistor to the fourth terminal 24. The collector of the second transistor 27 is connected to a second point 32 of connection between the second and the third transistors 27 and 28 through a resistor 33 while the emitter of the second transistor 27 is directly connected to the fourth terminal 24. The third transistor 28 has the base connected to the second point 32 of connection, which is connected to the third terminal 23 through a resistor 34, the emitter directly connected to the third terminal 23, and the collector connected to a time constant circuit to be presently described. The first through third transistors 26, 27, and 28 serve as a switching circuit responsive to each trigger pulse for producing a charging signal for the time constant circuit during presence of the trigger pulse.

In FIG. 5, the time constant circuit of the pulse generator 10 is for producing a variable level signal having a level variable between first and second predetermined levels. The first and the second predetermined levels may be equal to the source voltage of $V_{cc}$ and ground, respectively. The time constant circuit comprises a capacitor 35 of capacitance 330 pF and first, second, and third resistors 36, 37, and 38 of 100 ohms, 30 kiloohms, and 50 kiloohms, respectively. The first resistor 36 is connected between the collector of the third transistor 28 and a third point 40 of connection to prevent a rush current from instantaneously flowing through the third transistor 28. The first resistor 36 may be eliminated from the time constant circuit when no rush current takes place. Between the third point 40 of connection and the fourth terminal 24, the second resistor 37 and the capacitor 35 are connected in parallel. In addition, the third point 40 of connection is connected to the third resistor 38.

Further referring to FIG. 5, the pulse generator 10 comprises a fourth transistor 41 of the PNP type connected to the first terminal 21 and a fifth transistor 42 of the NPN type connected to the time constant circuit. The fourth transistor 41 has the base connected to the first terminal 21 together with the base of the first transistor 26, the emitter connected to the third terminal 23 through a resistor, and the collector connected to the base of the fifth transistor 42. The fifth transistor 42 has the base connected to the third resistor 38, the emitter connected to the fourth terminal 24, and the collector connected to the second terminal 22 directly and to the third terminal 23 through a resistor.

Figure 6:
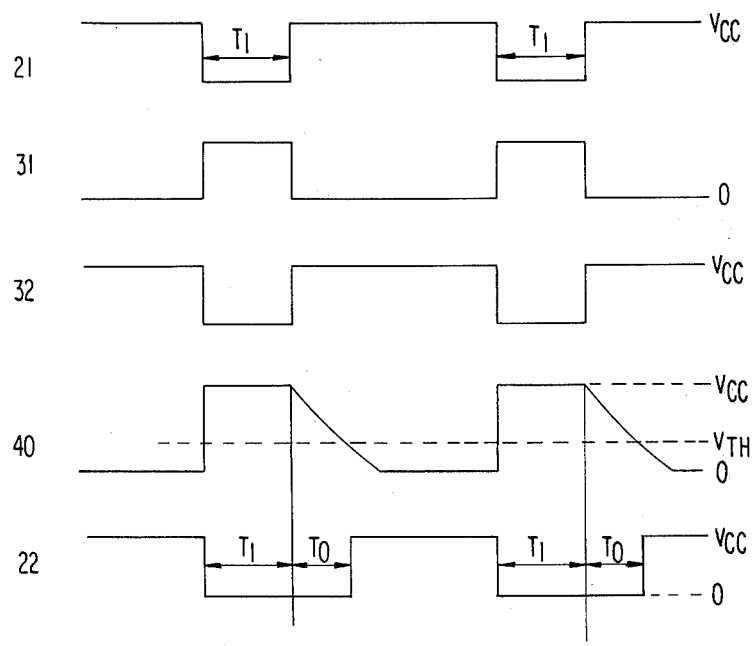
FIG. 6 shows wave forms for describing operation of the pulse generator illustrated in FIG. 5.

Referring to FIG. 5 again and FIG. 6 afresh, the input terminal 21 is given the trigger pulses as shown at 21 in FIG. 6 through the high-pass filter 16. Merely for simplicity of description, the pulses are depicted as having a common pulse width $T_1$. The first and fourth transistors 26 and 41 are simultaneously turned on and kept conductive during presence of each trigger pulse. The second and third transistors 27 and 28 are also turned on when the first transistor 26 is rendered conductive. As a result, the first and second points of connection 31 and 32 are given pulses which are antiphase relative to each other, as shown at 31 and 32 in FIG. 6. A current flows through the third transistor 28, which is kept conductive for the time being, to be supplied as the charging signal to the time constant circuit. The capacitor 35 of the time constant circuit is charged through the first resistor 36 during the time that the third transistor 28 is kept conductive. The capacitor 35 is a little charged through the third resistor 38. However, the third resistor 38 is considerably higher than the first resistor 36, as mentioned before. A time constant for charge of the time constant circuit is therefore dominantly decided by the value of the capacitor 35 and the first resistor 36 and is very small. As a result, the capacitor 35 is rapidly charged to the first predetermined level in accordance with the time constant for charge. When the trigger pulse disappears, the first through third transistor 26 through 28 are turned off to suspend the charging signal. The capacitor 35 is discharged through the second resistor 37 and also through the third resistor 38 as will become clear as the description proceeds. Each of the resistors 37 and 38 is considerably higher than the first resistor 36. The capacitor 35 is slowly discharged to ground in accordance with a time constant for discharge, which is decided by the resistors 37 and 38 and the capacitor 35. Thus, the time constant circuit has the time constant for discharge greater than the time constant for charge. When the charging signal is supplied to the capacitor 35, a voltage across the capacitor 35 rapidly rises from the second predetermined level to the first predetermined level. Therefore, a variable level appears as a variable level signal at the third point 40 of connection, as shown at 40 in FIG. 6. The base-emitter voltage of the fifth transistor 42 is varied simultaneously with the variable level developing at the third point 40 of connection. This shows that a variable level is supplied between the base and the emitter of the fifth transistor 42 as a variable level signal. The fifth transistor 42 has a threshold level $V_{TH}$ predetermined between the base and emitter thereof. The threshold level $V_{TH}$ is intermediate between the first and second predetermined levels. Although the fourth transistor 41 is turned off simultaneously with disappearance of the trigger pulse, the fifth transistor 42 remains conductive as long as the variable level is higher than the threshold voltage. Consequently, the fifth transistor 42 produces, in timed relation to the trigger pulse, a wide pulse wider in pulse width than the trigger pulse. The wide pulse lasts until the variable level becomes equal to the threshold level during the discharge of the time constant circuit. The output terminal 22 is given as an output pulse the wide pulse through the collector of the fifth transistor 42, as shown at 22 in FIG. 6. The output pulse has a pulse width equal to the sum of the width $T_1$ of the trigger pulse and a width $T_0$ determined by the second and third resistors 36 and 37 and the capacitor 35. In a practical example, the widths $T_1$ and $T_0$ are about 10 and 30 microseconds, respectively.

Figure 7:
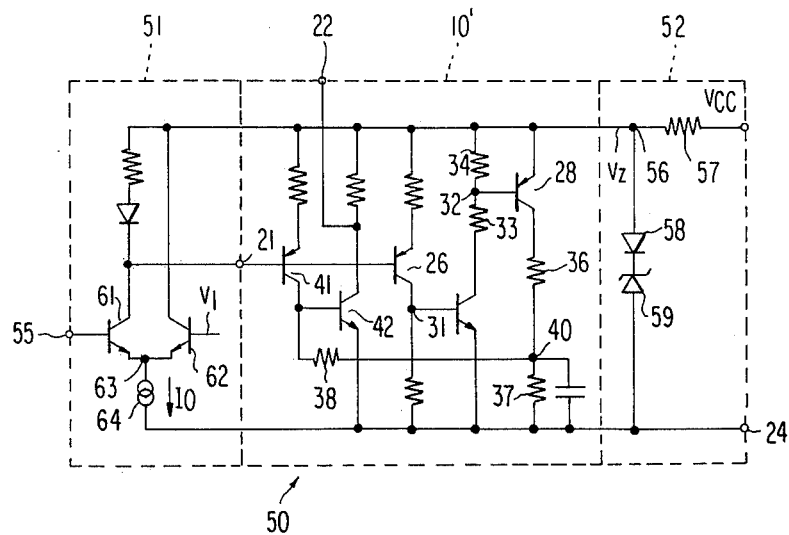
FIG. 7 is a circuit diagram of a pulse generator according to a second embodiment of this invention.

Referring to FIG. 7, a pulse generator 50 according to a second embodiment of this invention comprises, in addition to a pulse generator portion 10' illustrated with reference to FIG. 5, a constant current portion 51 and a constant voltage portion 52. Herein, the input pulse supplied to the first terminal 21 of the pulse generator portion 10' is derived from the constant current portion 51. Similar parts are designated by like reference numerals as in FIG. 5. The constant current portion 51 has a circuit input terminal 55 for the trigger pulse and is connected to the first terminal 21. The constant voltage portion 52 is for impressing, between the fourth terminal 24 and a fourth point of connection 56, a constant voltage $V_z$ which is supplied to the pulse generator portion 10' and the constant current portion 51. The constant voltage portion 52 comprises a resistor 57 connected between the third terminal 23 and the fourth connecting point 56 and a series connection of a diode 58 and a zener diode 59 which is connected between the fourth point 56 and the fourth terminal 24. The constant current portion 51 comprises a differential amplifier comprising sixth and seventh transistors 61 and 62. The emitters of the sixth and seventh transistors 61 and 62 are connected in common to a fifth point 63 of connection. A constant current circuit 64 is connected between the fifth point 63 of connection and the fourth terminal 24 to cause a constant current $I_0$ to selectively flow through one of the sixth and seventh transistors 61 and 62. The sixth transistor 61 has the base connected to the circuit input terminal 55, which is grounded as regards direct current, the collector coupled to the fourth point 56 of connection and also connected to the first terminal 21. The seventh transistor 62 has the collector connected to the fourth point 56 of connection and the base given a predetermined constant level $V_1$ higher than the base bias level of the sixth transistor 61.

Figure 8:
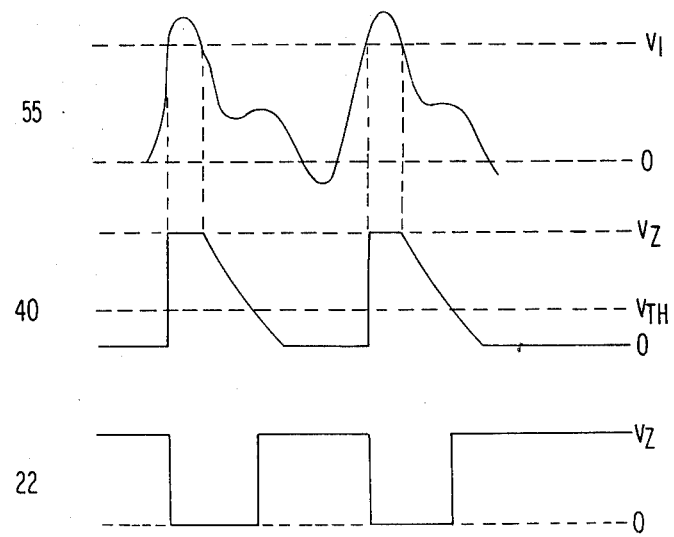
FIG. 8 shows wave forms for describing operation of the pulse generator illustrated in FIG. 7.

Referring to FIG. 7 again and FIG. 8 afresh, the constant current portion 51 is supplied through the circuit input terminal 55 with the trigger pulse having a variable amplitude as shown at 55 in FIG. 8. While the amplitude is less than the predetermined level $V_1$, the constant current $I_0$ flows through the seventh transistor 62 and, therefore, the first terminal 21 is given a voltage equal to the source voltage $V_z$. Under the circumstances, no pulse is supplied to the pulse generator portion 10'. When the amplitude of the trigger pulse exceeds the predetermined level $V_1$, the sixth transistor 61 is turned on to cause the constant current $I_0$ to flow therethrough while the seventh transistor 62 is turned off. The pulse generator portion 10' is supplied with the input pulse through the first terminal 21 until the trigger pulse is rendered less than the predetermined level $V_1$. As a result, the first through third transistors 26 through 28 are rendered conductive and the capacitor 35 is rapidly charged to the constant voltage $V_z$, as shown at 40 in FIG. 8 in accordance with a time constant for charge defined by the capacitor 35 and the resistor 36, as is the case with the pulse generator 10 illustrated in FIG. 5. Simultaneously with the first through third transistors 26 through 28, the fourth and fifth transistors 41 and 42 are also turned on. When the trigger pulse disappears, the first through fourth transistors 26, 27, 28, and 41 are turned off and the capacitor 35 is gradually discharged through the second and third resistors 37 and 38 to provide the variable level between the base and the emitter of the fifth transistor 42, as shown at 40 in FIG. 8. The fifth transistor 42 is kept conductive during the time that the variable level exceeds the predetermined threshold level $V_{TH}$ after disappearance of the trigger pulse. An output pulse shown at 22 in FIG. 8 appears at the second terminal 22 through the collector of the fifth transistor 42.

According to the second embodiment, the pulse generator 50 is given the source voltage stabilized by the constant voltage portion 52. The input pulse is impressed to the pulse generator portion 10' with a constant amplitude determined by the constant current $I_0$. Therefore, the pulse generator 50 is capable of producing at a high speed a pulse having an accurate pulse width.

While this invention has so far been described in conjunction with a few preferred embodiments thereof, it is readily possible for those skilled in the art to put the invention into practice in various manners. For example, the first, third, and fourth transistors 26, 28, and 41 may be of the NPN type and the second and fifth transistors 27 and 42, of the PNP type. The polarity of the power source voltage should be inversed in this case.

What is claimed is:

1. A pulse generator for use in a noise canceller responsive to a variable noise pulse for producing a corresponding variable output pulse simultaneously with said input pulse for application to said noise canceller, wherein the improvement comprises:

first means responsive to said noise pulse for producing a charging signal during presence of said noise pulse;

a time constant circuit responsive to said charging signal and having a first time constant for charge and a second time constant for discharge which is greater than said first time constant, said time constant circuit being charged in accordance with said first time constant when said charging signal is supplied thereto and discharged in accordance with said second time constant when said noise pulse disappears, said time constant circuit thereby producing a variable level signal having a variable level between a first and a second predetermined level;

second means (41) responsive to said noise pulse for producing an energizing signal during presence of said noise pulse; and an output transistor (42) coupled directly to said second means and energized by said energizing signal in timed relation to a leading edge of said noise pulse, said output transistor having a base, an emitter and a collector, said variable level signal being coupled to said base a determined reference level being provided between said base and said emitter for switching said output transistor in response to said variable level signal, said preselected level being intermediate between said first and said second predetermined levels, said output transistor producing, through said collector, a widened pulse in timed relation to a trailing edge of said noise pulse, said widened pulse being wider than said noise pulse in pulse width and lasting until said variable level becomes equal to said preselected level during the discharge of said time constant circuit, wherein a trailing edge of said widened pulse occurs a predetermined fixed time after said trailing edge of said noise pulse.

2. A pulse generator as claimed in claim 1, wherein said pulse generator further comprises:

fourth means responsive to a system input signal having a variable amplitude for comparing said amplitude of said system input signal with a predetermined threshold level and to produce a resulting pulse during an interval that said system input signal amplitude exceeds said predetermined threshold level; and means for supplying said first and said second means with said resulting pulse as said noise pulse.

3. A pulse generator for use in a noise canceller responsive to a variable noise pulse for producing a corresponding variable output pulse simultaneously with said input pulse for application to said noise canceller comprising:

a switching circuit responsive to said noise pulse for producing a switching signal in an active state during the presence of said noise pulse;

a time constant circuit comprising a first resistor and a capacitor coupled in series with said first resistor;

a second resistor coupled between said switching circuit and said time constant circuit;

a driver transistor responsive to said noise pulse;

an output transistor receiving at a base thereof an output signal directly from said driver transistor; and a third resistor coupled between said base of said output transistor and said time constant circuit, the resistance of said second resistor being substantially less than the resistances of said first and third resistors.

4. A pulse generator as claimed in claim 3, wherein said resistance of said first resistor is greater than said resistance of said third resistor.

5. A pulse generator for use in a noise canceller responsive to a variable noise pulse for producing a corresponding variable output pulse simultaneously with said input pulse for application to said noise canceller comprising:

a first transistor of a first conductivity type having a base coupled to receive a noise pulse and an emitter coupled to a voltage source terminal through a first resistor;

a second transistor of a second conductivity type having a base coupled to a collector of said first transistor, an emitter coupled to ground, and a collector coupled to said terminal through a second resistor;

a third transistor of said first conductivity type having a base coupled to said base of said first transistor, an emitter coupled to said terminal through a third resistor, and a collector coupled to ground through a fourth resistor;

a fourth transistor of said second conductivity type having a base coupled to said collector of said third transistor, an emitter coupled to ground, and a collector coupled to said terminal through series-connected fifth and sixth resistors;

a fifth transistor of said first conductivity type having an emitter coupled to said terminal and a base coupled to a common connection point between said fifth and sixth resistors;

a time constant circuit comprising a seventh resistor and a capacitor, first terminals of said seventh resistor and said capacitor being coupled to each other and second terminals of said seventh resistor and said capacitor being coupled to ground;

an eighth resistor being coupled between an emitter of said fifth transistor and said first terminals of said seventh resistor and said capacitor; and a ninth resistor coupled between said collector of said first transistor and said first terminals of said seventh resistor and said capacitor.

6. A pulse generator as claimed in claim 5, wherein the resistance of said eighth resistor is substantially less than the resistances of said seventh and ninth resistors.

7. A pulse generator as claimed in claim 6, wherein said resistance of said seventh resistor is greater than said resistance of said ninth resistor.

* * * * *